United States Patent [19]

Franz et al.

[11] Patent Number: 4,513,365
[45] Date of Patent: Apr. 23, 1985

[54] FUNCTION SELECTOR

[75] Inventors: Reinhard Franz, Tulpenstrasse 15, D-5401 Emmelshausen, Fed. Rep. of Germany; Wilfried Dittmar, Halsenbach; Günter Daubach, Leverkusen, both of Fed. Rep. of Germany

[73] Assignee: Reinhard Franz, Emmelshausen, Fed. Rep. of Germany

[21] Appl. No.: 465,252

[22] Filed: Feb. 9, 1983

[30] Foreign Application Priority Data

Feb. 11, 1982 [DE] Fed. Rep. of Germany ....... 3204787

[51] Int. Cl.³ .................... G06F 15/46; G09B 15/08; G10G 1/02
[52] U.S. Cl. .................................. 364/140; 364/419; 84/1.01; 84/478; 84/DIG. 23; 307/38; 307/141.8
[58] Field of Search .................. 364/140, 419; 307/38–41, 139, 141, 141.1, 141.8; 84/1.08, 18, 1.01, 478, DIG. 23

[56] References Cited

U.S. PATENT DOCUMENTS

| | | | | |
|---|---|---|---|---|
| 3,610,800 | 10/1971 | Deutsch | ............................ | 84/1.01 |
| 3,614,287 | 10/1971 | Klann | ............................ | 84/1.08 |
| 3,743,755 | 7/1973 | Watson | ............................ | 84/1.01 |
| 3,794,747 | 2/1974 | Obayashi | ............................ | 84/1.08 |
| 4,281,579 | 8/1981 | Bennett, Sr. | ............................ | 84/478 |
| 4,422,365 | 12/1983 | Iwaki | ............................ | 84/478 |

Primary Examiner—Jerry Smith
Assistant Examiner—John R. Lastova
Attorney, Agent, or Firm—Peter K. Kontler

[57] ABSTRACT

A function selector has an indicating unit which contains several identical groups of switches. All of the switches are connected with a control input of a microcomputer via a common control conductor. Each group of switches is connected to a different data input of the microcomputer by means of an identification conductor common to all switches of the group. An indicating shift register is associated with every group of switches and each switch of a group, as well as its corresponding light source, are connected to a different stage of the respective indicating shift register. An activating shift register is connected in parallel with each indicating shift register. The stages of the activating shift registers are connected with respective function generating elements. The microcomputer has a series of data outputs each of which is connected both with an indicating shift register and the corresponding activating shift register. Logic elements are interposed between each group of switches and the corresponding input of the microcomputer and insure that the respective input receives a different signal when a switch is open than when it is closed.

33 Claims, 2 Drawing Figures

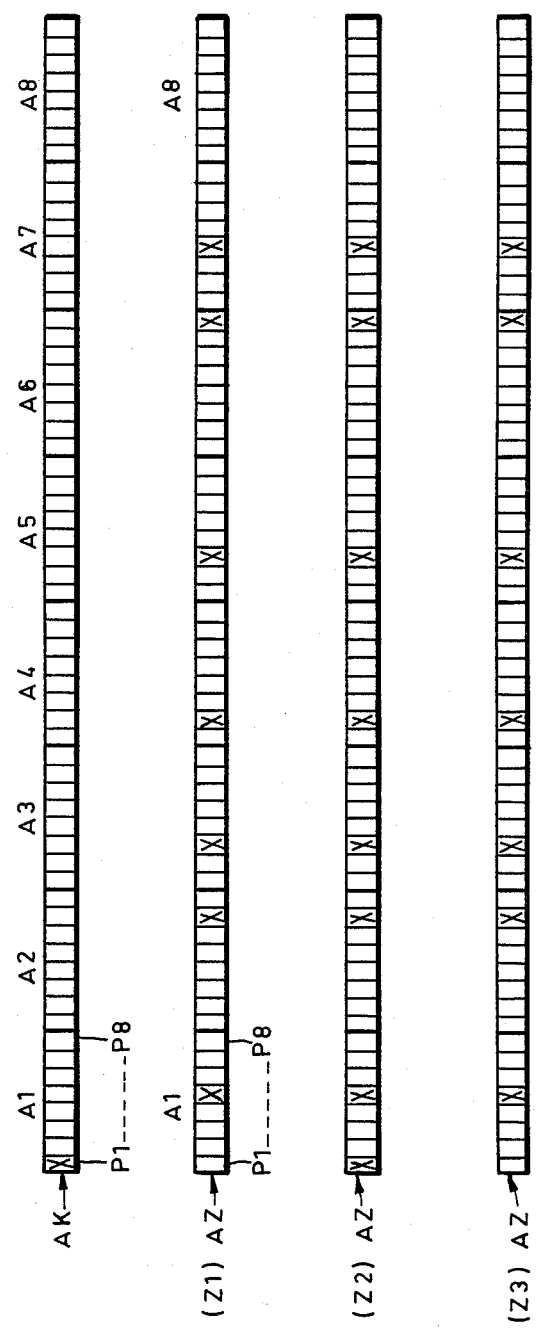

FUNCTION SELECTOR

BACKGROUND OF THE INVENTION

The invention relates generally to a function selector, especially a function selector for an electronic musical instrument.

More particularly, the invention relates to a circuit for indicating the operational states of the switches in a function selector which control the performance of the various functions.

In a conventional function selector, the switches which control the performance of the various functions may be activated individually. Each of the switches is associated with a light source which indicates the operational state of the respective switch, that is, which indicates whether or not the function control by the respective switch is being performed. An electronic control unit is provided to check the operational states of the switches and serves to illuminate the light source associated with a switch when the switch is in the "on" position so that the function controlled by the switch is being performed.

A known circuit of the type described above is employed in an electronic organ. Each switch is directly connected with a function generating element and with a light source. When a switch is closed, the corresponding function generating element causes the respective function to be performed and, at the same time, the light source connected with the switch is illuminated. The switch is arrested in its closed position. The performance of the respective function is terminated and the light source is switched off by returning the switch to its initial or "off" position.

In the preceding circuit, the conductors between the switches and the function generating elements are a source of considerable expense. This is particularly true when there is a large number of functions which can be performed as is the case in an electronic musical instrument. The expense for the conductors is further increased when the switches and the function generating elements are located at a relatively great distance from one another. This is likewise frequently the case in an electronic musical instrument. Thus, it is often desired for the switches to be located in the area of the keys while the electronics for the function generating elements are situated inside the case of the instrument.

OBJECTS AND SUMMARY OF THE INVENTION

It is an objection of the invention to provide a function selector in which the arrangement of the conductors is less complex than in conventional function selectors.

Another object of the invention is to provide a function selector in which the conductors constitute a lesser source of expense than in conventional function selectors.

It is also an object of the invention to provide a circuit of the type outlined above which, while permitting ready operation of the switches, has fewer conductors than heretofore between the unit containing the switches and their associated elements and the components located outside of this unit.

A concomitant object of the invention is to provide a relatively simple conductor arrangement in a circuit for indicating the operational states of switches.

Yet another object of the invention is to provide a relatively inexpensive conductor arrangement in a circuit for indicating the operational states of switches.

The preceding objects, as well as others which will become apparent as the description proceeds, are achieved by the invention.

One aspect of the invention resides in an arrangement for indicating the operational states of switches. The arrangement comprises the following:

A. A plurality of groups of switches. The switches are individually movable between open and closed positions to cause the performance of selected functions. The switches are preferably key-operated switches which are urged to one of their positions in response to manipulation, e.g. depression, of a key such as found on the keyboard of an electronic musical instrument and which are biased so as to automatically return to the other position. The switches are advantageously biased towards their open positions and are urged to their closed positions in response to manipulation of a key.

B. An indicator connected with each of the switches and designed to indicate the operational state of the respective switch, i.e. designed to indicate whether or not the function controlled by the switch is being performed. Preferably, the indicators are in the form of light sources, especially light-emitting diodes. The light sources are advantageously illuminated when the functions controlled by the respective switches are being performed and are darkened when the respective functions are not being carried out.

C. A plurality of devices each having a first input, a clocking input, and a series of stages designed to receive signals in a predetermined sequence via the first input in response to the delivery of clocking pulses to the clocking input. Each of the devices is associated with a different group of switches and each stage has a first output which is connected with a respective switch of the corresponding group and with the light source for the switch. Preferably, the devices are in the form of shift registers. The shift registers advantageously have the same number of stages.

D. A control unit having a control input, and a clocking output common to and connected with the clocking inputs of all of the shift registers. The control unit is preferably in the form of a computer, especially a microcomputer. The microcomputer comprises at least one memory having a plurality of sets of storage elements. Each set is associated with a different shift register and each storage element is associated with a different stage of the corresponding shift register. In a preferred embodiment of the invention, the shift registers have the same number of stages and the number of storage elements in each set equals the number of stages. Each storage element is then advantageously designed to store one bit of information. The microcomputer has a plurality of second outputs each of which is connected with the first input of a different shift register and is designed to be sequentially connected with the storage elements of the set associated with the corresponding shift register. Similarly, the microcomputer has a plurality of second inputs each of which is associated with a different shift register and is designed to be sequentially connected with the storage elements of the set associated with the corresponding shift register. The control unit is designed to generate a first series of clocking pulses subsequent to arrival of a control signal at the control input to thereby cause a reference signal to be advanced from one stage of each of the shift registers to another in the respective predetermined sequence. When the number of stages in the different shift registers and the number of storage elements in the various sets are the same, the number of clocking pulses in the first series preferably equals the number of stages in each shift register and the number of storage elements in each set. Each of the reference signals may, for example, represent a 0-bit of information. The reference signals result in the generation of identifying signals representative of the operational states of the switches. Each of the second inputs of the microcomputer is connected with the storage elements of the associated set in substantial synchronism with the arrival of the reference signal at the corresponding stages of the respective shift register. This permits information representative of the identifying signals to be stored in the respective storage elements. The microcomputer is also designed to generate a second series of clocking pulses subsequent to the first series. Again, when the number of stages in the various shift registers and the number of storage elements in the different sets are the same, it is preferred for the number of clocking pulses in the second series to equal the number of stages in each shift register and the number of storage elements in each set. The second outputs of the microcomputer are connected with the storage elements of the associated sets in the respective predetermined sequence and in substantial synchronism with the clocking pulses of the second series so as to permit operating signals representative of the identifying signals to be furnished to the respective stages of the shift registers. Each of the light sources provides an indication of the operational state of the associated switch in dependence upon the respective operating signal. For example, an operating signal may cause a light source to become illuminated or to remain illuminated if the function controlled by the respective switch is being performed. Conversely, an operating signal may cause a light source to be extinguished or to remain extinguished if the function controlled by the respective switch is not being carried out.

E. A plurality of signal generating circuits each of which is associated with a different group of switches and has a first conductor common to and connecting all switches of the group of the corresponding second input of the microcomputer. The signal generating circuits are preferably logic circuits. Each of the logic circuits is designed to generate a series of identifying signals in the respective predetermined sequence during the first series of clocking pulses and to transmit the series of identifying signals to the corresponding second input of the microcomputer in the same sequence. Each of the logic circuits is also designed to generate a control signal upon movement of at least one switch of the respective group to one of its positions, e.g. the closed position.

F. A second conductor for transmitting control signals to the control input of the microcomputer. The second conductor is common to all of the switches and connects all of the logic circuits with the control input.

The arrangement in accordance with the invention is well-suited for use in a function selector, especially a function selector of an electronic musical instrument.

In the arrangement according to the invention, only 2n+2 conductors are required between the microcomputer and the indicating unit containing the shift registers, the logic circuits and the switches. Here, n represents the number of shift registers. For instance, if eight shift registers having eight stages each are used, there are eight switches per shift register for a total of 64 switches and 64 functions. However, only 18 conductors are required. The number of conductors may be reduced to six for the same number of switches and functions if two shift registers having 32 stages each are utilized. Nevertheless, for the same number of switches and functions, the number of clocking pulses for each shifting routine, i.e. for complete passage through a shift register, increases as the number of shift registers decreases and the number of stages per shift register correspondingly increases. Accordingly, the processing time increases which reduces the amount of time available for the microcomputer to perform other operations. When the number of switches and functions remains constant while the number of shift registers is increased so that the number of stages per shift register decreases, the time required for the microcomputer to carry out the operations necessary to indicate the operational states of the switches, i.e. the time required for the microcomputer to carry out the shifting routines, is reduced. In any event, the number of conductors between the microcomputer and the indicating unit containing the other components is smaller than that where the switches are directly connected with the function generating elements.

Each of the switches is preferably designed to be urged from its open position to its closed position in response to manipulation of a key and to return to its open position when the pressure on the key is released. The keys may then be simply constructed and require no locking or arresting elements.

The frequency of the clocking pulses may be so high that all of the shifting operations are completed within a very short time interval. It is then necessary to manipulate the key for a switch only briefly, that is, to tap the key, in order to generate the corresponding function, that is, in order to activate the corresponding function generating element. Similarly, the performance of the selected function may be discontinued by a renewed brief manipulation of the same key.

The microcomputer may generate normalizing or clearing signals prior to the reference signals. The normalizing signals are different from the reference signals. By way of example, the normalizing signals may represent opposite bits of information from the reference signals. Thus, if the reference signals represent 0-bits of information, the normalizing signals may represent 1-bits of information. The normalizing signals are generated in response to arrival of a control signal at the control input of the microcomputer and are furnished to each stage of each shift register. The microcomputer may generate an additional series of clocking pulses prior to the first series of clocking pulses in order to transmit the normalizing signals to the various stages of the shift registers. When the number of stages in the different shift registers are the same, the number of clocking pulses in the additional series preferably equals the number of stages in each shift register.

The first series of clocking pulses causes advancement of the reference signals through the stages of the shift registers. During this series of clocking pulses, the microcomputer may generate additional signals which are different from the reference signals. For instance, such additional signals may represent opposite bits of information from the reference signals and may accordingly be the same as the normalizing signals. Thus, if the reference signals represent 0-bits of information, the additional signals may represent 1-bits of information.

The additional signals are furnished to the stages of the shift registers upon advancement of the reference signals therefrom. In other words, when a reference signal leaves a stage of a shift register, an additional signal is supplied to such stage. The additional signals may be transmitted to the stages of the shift registers in response to the clocking pulses of the first series.

The memory of the microcomputer may be designed to store information representative of the instantaneous operational states of all of the switches. This instantaneous memory is preferably constructed in such a manner that its contents remain intact when the operating signals are transmitted from the memory to the stages of the shift registers.

The microcomputer may further comprise an additional memory which is designed to temporarily store information representative of changes in the operational states of the switches. This additional or change memory again has a plurality of sets of storage elements. When the shift registers have the same number of stages, the number of storage elements in each set of the change memory preferably equals the number of stages in each shift register. It if preferred that each storage element of the additional memory be designed to store 1-bit of information.

The change memory is interposed between the second inputs of the microcomputer and the instantaneous memory. Each set of the change memory is associated with a different set of the instantaneous memory. The storage elements of associated sets are paired, that is, each storage element of a set belonging to the change memory is coupled to a different storage element of the associated set belonging to the instantaneous memory. In this manner, information may be transferred from the storage elements of the change memory to the storage elements of the instantaneous memory. Preferably, the coupling between pairs of storage elements is a so-called nonequivalent or exclusive OR coupling.

As mentioned earlier, each of the second inputs of the microcomputer is connected with the storage elements of the associated set of the instantaneous memory in substantial synchronism with the arrival of the reference signal at the corresponding stages of the respective shift register. When the change memory is present, each of the second inputs is arranged to be connected with the storage elements of the associated set of the change memory in substantial synchronism with the arrival of the reference signal at the corresponding stages of the respective shift register. The connection between the second inputs of the microcomputer and the storage elements of the instantaneous memory is then an indirect connection via the storage elements of the change memory.

According to one embodiment of the invention, a voltage divider is associated with each of the switches. Each of the voltage dividers may include two resistors which are located on opposite sides of the respective switch. Preferably, one such resistor is common to all switches of a group, that is, all of the voltage dividers associated with a group of switches preferably have one resistor in common. One resistor of each voltage divider may have a common junction with the associated switch and the output of the corresponding stage of the respective shift register. In the event that all of the voltage dividers which are associated with a group of switches have a common resistor, it is preferred that the other resistors form common junctions with the respective switches and the respective outputs of the stages of the shift registers. A diode may be arranged between each such common junction and the output of the corresponding stage of the respective shift register. Furthermore, a blocking unit may be arranged between each group of switches and the corresponding input of the microcomputer. The blocking units constitute part of the logic circuits associated with various groups of switches. The blocking units are designed to prevent identifying signals representative of the operational states of the switches from being transmitted to the microcomputer when the voltages on the input sides of the blocking units lie below predetermined values.

The preceding embodiment of the invention permits the components of the logic circuits to be used not only for the generation of the identifying signals transmitted to the second inputs of the microcomputer but also for the generation of control signals upon activation of a switch. This enables the number of components to be reduced.

According to another embodiment of the invention, each of the blocking units includes a Zener diode.

This embodiment of the invention enables the blocking units to have a simple design.

A further embodiment of the arrangement according to the invention includes a plurality of activating units each having first input means connected with a different second output of the microcomputer and clocking input means connected with the clocking output of the microcomputer. Each of the activating units comprises a series of stages designed to receive signals in a preselected sequence via the first input means in response to the delivery of clocking pulses to the clocking input means. The activating units are preferably in the form of shift registers and each such activating shift register is advantageously connected in parallel with a different indicating shift register, that is, with a different one of the shift registers forming part of the indicating unit. It is preferred for the number of stages in the activating shift registers to be the same as the number of stages in the indicating shift registers. Each stage of an activating shift register is associated with a different switch of the group corresponding to the indicating shift register with which the activating shift register is connected in parallel. Each stage of an activating shift register has first output means arranged to emit an activating signal for a given function upon activation of the corresponding switch. The activating shift registers emit activating signals in response to receipt of an enabling signal from the microcomputer. To this end, each of the activating shift registers has an enabling input which is connected with an enabling output of the microcomputer. Preferably, the enabling output of the microcomputer is common to the enabling inputs of all the activating shift registers.

In the embodiment of the invention just described, only a small number of conductors is required between the microcomputer and the activating shift registers. This number is n+2 where n is the number of activating shift registers. Accordingly, if the microcomputer is incorporated in the indicating unit, the number of conductors which issue from the indicating unit may be reduced below the 2n+2 mentioned earlier. in other words, only n+2 conductors need then issue from the indicating unit in order to connect the same with the activating shift registers which are located remote therefrom, i.e. which are located in the region of the function generating elements.

The novel features which are considered as characteristic of the invention are set forth in particular in the appended claims. The improved function selector and the circuit therefor, however, both as to design and mode of operation, together with additional features and advantages thereof, will be best understood upon perusal of the following detailed description of certain specific embodiments with reference to the accompanying drawings.

BRIEF DESCRIPTION OF THE DRAWINGS

FIG. 2 schematically illustrates a pair of memories for the microcomputer of FIG. 1.

DESCRIPTION OF THE PREFERRED EMBODIMENTS

Figure 1:
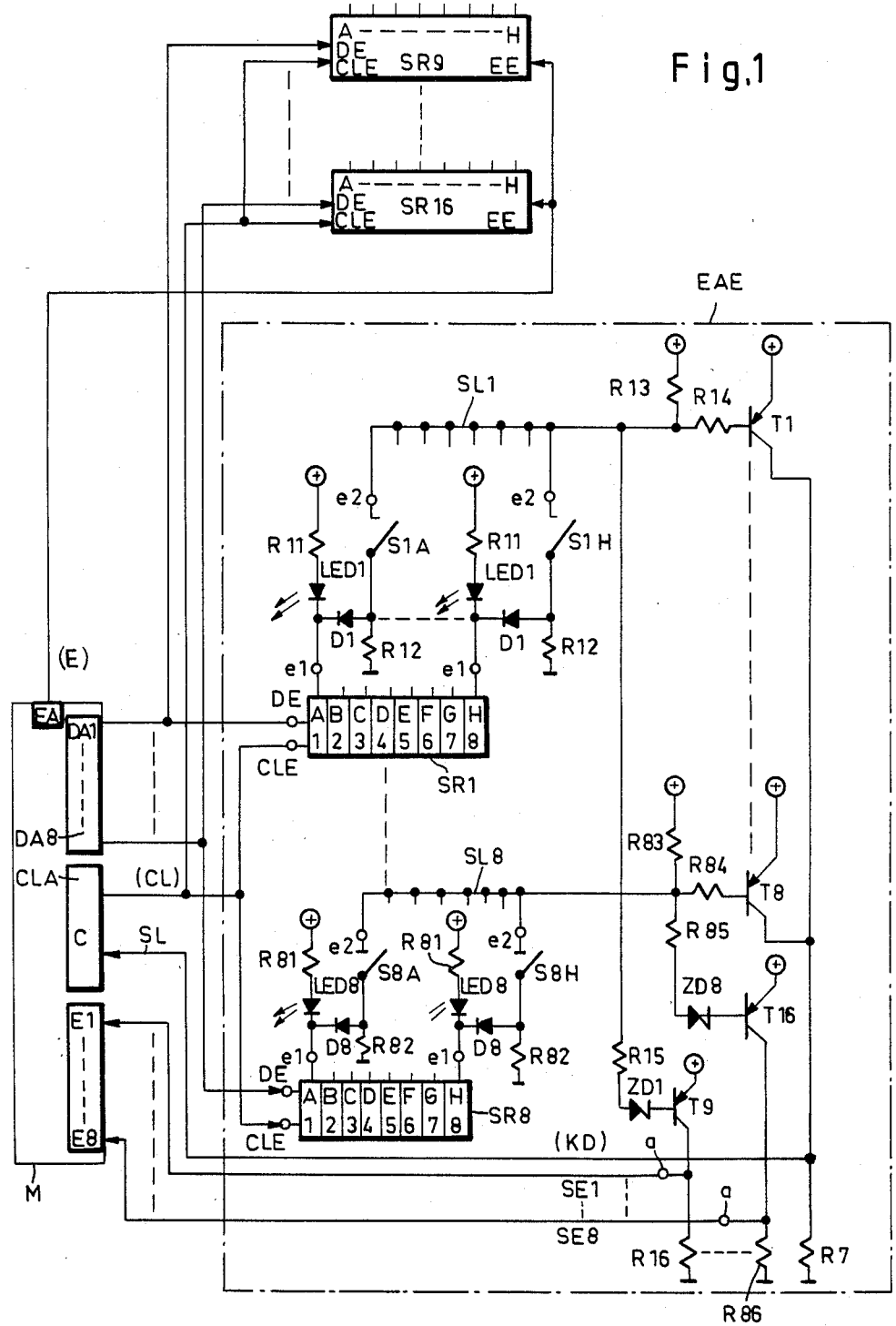
FIG. 1 illustrates a circuit according to the invention which includes a microcomputer and may be used in a function selector.

The circuit of FIG. 1 is here assumed to be designed for the selection of various functions in an electronic organ, e.g. for the selection of different effects such as tremolo, percussion, piano, vibrato, chorus and like effects. However, this circuit may also be used for the selection of various functions in other types of equipment. For instance, the circuit of FIG. 1 may equally well be used to select different modes of operation for a machine.

The circuit of FIG. 1 includes an indicating unit EAE which is provided with a non-illustrated keyboard for selecting the various functions. The keyboard controls eight groups of switched and each group, in turn, comprises eight switched. The switches of the first group are respectively identified as S1A . . . S1H; the switched of the second group as S2A . . . S2H; and so on up to the eighth group where the switches are respectively identified as S8A . . . S8H. For the sake of clarity, only the first and eighth switches S1A and S1H of the first group and the first and eighth switches S8A and S8H of the eighth group are shown. The switches S1A-S8H are movable between open and closed positions and are biased to the open positions shown in FIG. 1 by means of springs. Activation of the switches S1A-S8H, i.e. closing of the switches S1A-S8H, occurs against the forces exerted by the springs and the switches S1A-S8H thus automatically return to their starting positions, that is, to their open positions, after activation. Instead of the illustrated mechanical switches S1A-S8H, it is possible to use switches in the form of electronic sensors. Such electronic switches may be designed to move, e.g. pivot, to one of their positions when in contact with or in close proximity to a stationary activating field and to move to the other of their positions when the influence of the activating field is removed.

The switches S1A-S8H are arranged to be activated individually.

The indicating unit EAE includes eight shift registers SR1, SR2 . . . SR8. The shift register SR1 is associated with the group of switches S1A-S1H; the shift register SR2 is associated with the group of switches S2A-S2H; and so on. Again, only the shift register SR1 associated with the first group of switches S1A-S1H and the shift register SR8 associated with the eighth group of switches S8A-S8H are shown. Each of the shift registers SR1-SR8 has eight stages 1-8 having respective outputs A-H. The first switch S1A-S8A of each group is connected with the output A of stage one of the associated shift register SR1-SR8 via a respective diode D1-D8; the second shift S1B-S8B of each group is connected with the output B of stage two of the associated shift register SR1-SR8 via a respective diode D1-D8; and so on.

Each of the switches S1A-S1H of the first group is connected with ground or with the zero potential of a source of operating voltage via a respective resistor R12. Furthermore, all of the switches S1A-S1H of the first group are connected with a common conductor SL1. Similarly, each of the switches S2A-S2H of the second group is connected with ground or with the zero potential of the source of operating voltage via a respective resistor R22. All of the switches S2A-S2H of the second group are further connected with a common conductor SL2. The same applies for the remaining groups of switches S3A-S3H; . . . ; S8A-S8H.

Each of the switches S1A-S8H has a common junction with the respective resistor R12-R82 and the respective output A-H of the corresponding shift register SR1-SR8. The diodes D1-D8 are located between the respective common junctions and the outputs A-H of the corresponding shift registers SR1-SR8.

Each of the outputs A-H of the shift register SR1 is connected with the positive pole of the source of operating voltage via a light source LED1 and a resistor R11; each output A-H of the shift register SR2 is connected with the positive pole of the source of operating voltage via a light source LED1 and a resistor R21; and so on. The light sources LED1-LED8 are advantageously in the form of light-emitting diodes.

The common conductor SL1 is connected with the positive pole of the source of operating voltage via a resistor R13; the common conductor SL2 is connected with the positive pole of the source of operating voltage via a resistor R23; and so on. Each of the resistors R12 constitutes a voltage divider together with the resistor R13 so that each of the switches S1A-S1H is associated with a voltage divider R12, R13. Each of the switches S1A-S1H is located between the pair of resistors R12 and R13 constituting the respective voltage divider R12, R13. The resistor R13 is common to all of the voltage dividers for the group of switches S1A-S1H. Similarly, each of the resistors R22 constitutes a voltage divider together with the resistor R23 so that each of the switches S1A-S2H is associated with a voltage divider R22, R23. The respective switches S2A-S2H are located between the pair of resistors R22 and R23 constituting the associated voltage divider R22, R23. The resistor R23 is common to all of the voltage dividers for the group of switches S2A-S2H. The same applies to the remaining groups of switches S3A-S3H; . . . ; S8A-S8H.

The common conductor SL1 is further connected with the base of a transistor T1 via a resistor R14; the common conductor SL2 is further connected with the base of a transistor T2 via a resistor R24; and so on. The transistors T1-T8 are here assumed to be pnp transistors. The collectors of all the transistors T1-T8 are connected with 0 potential via a common resistor R7 and are additionally connected with a control input C of a microcomputer M by means of a common control conductor SL. The emitters of the transistors T1-T8 are connected with the positive pole of the source of operating voltage.

The common conductor SL1 is also connected with the base of a further transistor T9 via a resistor T15 and a Zener diode ZD1; the common conductor SL2 is also connected with the base of a further transistor T10 via a resistor R25 and a Zener diode ZD2; and so on. The collectors of the further transistors T9–T16 are connected with 0 potential by means of respective resistors R16–R86. In addition, the collector of each transistor T9–T16 is connected with a respective data input E1–E8 of the microcomputer M via a respective identification conductor SE1–SE8. The emitters of the transistors T9–T16 are connected with the positive pole of the source of operating voltage.

The circuit of FIG. 1 includes eight activating shift registers SR9–SR16 in addition to the eight indicating shift registers SR1–SR8 constituting part of the indicating unit EAE. Each of the activating shift registers SR9–SR16 has eight stages 1–8 like the indicating shift registers SR1–SR8. Similarly, to the stages 1–8 of the indicating shift registers SR1–SR8, each of the stages 1–8 of an activating shift register SR9–SR16 has a respective output A–H. All of the shift registers SR1–SR16 have a data input DE as well as a clocking input CLE. The activating shift registers SR9–SR16 additionally have an enabling input EE.

The microcomputer M has eight data outputs DA1–DA8. The data output DA1 is connected with the data input DE of the indicating shift register SR1 as well as the data input DE of the activating shift register SR9; the data output DA2 is connected with the data input DE of the indicating shift register SR2 as well as the data input of the activating shift register SR10; and so on. The microcomputer M further has a clocking output CLA which is connected with the clocking inputs CLE of all the shift registers SR1–SR16. In addition, the microcomputer M has an enabling output EA which is connected with the enabling inputs EE of all the activating shift registers SR9–SR16.

The common conductor SL1 and the corresponding transistor T1 form an OR coupling for denoting the positions of the switches S1A–S1H of the associated group; the common conductor SL2 and the corresponding transistor T2 form an OR coupling for denoting the positions of the switches S2A–S2H of the associated group; and so on. Each common conductor SL1–SL8 and its corresponding transistor T1–T8 likewise forms a NAND coupling which indicates the connection of the base of a transistor T1–T8 to 0 potential due to closing of one or more switches of the associated group S1A–S1H; ...; S8A–S8H, e.g. the common conductor SL1 and the corresponding transistor T1 form a NAND coupling which indicates the connection of the base of the transistor T1 to 0 potential due to closing of one or more of the switches S1A–S1H.

If, for example, one of the switches of the group S1A–S1H is closed, the potential at the base of the corresponding transistor T1, which was previously maintained at a high value via the resistor R13, is reduced to such an extent that the transistor T1 becomes conductive. Accordingly, a high potential becomes manifest at the collector of the transistor T1 thereby indicating that at least one of the switches S1A–S1H is closed.

The control conductor SL functions as an OR coupling for the signals which are generated by the transistors T1–T8 and constitute control signals. The appearance of a high potential, that is, a control signal KD having a value of one, in the control conductor SL indicates that at least one of the entire series of switches S1A–S8H is closed.

The components SL1, R12, R13, R14 and T1 associated with the group of switches S1A–S1H together constitute a logic circuit having eight inputs e2, i.e. having one input e2 for each of the eight switches S1A–S1H. This logic circuit always causes a control signal to be generated at the collector of the transistor T1 when at least one switch of the group S1A–S1H is activated or, in other words, is closed. Similarly, the components SL2, R22, R23, R24 and T2 associated with the group of switches S2A–S2H together constitute a logic circuit which has eight inputs e2 and always generates a control signal at the collector of the transistor T2 when at least one switch of the group S2A–S2H is activated or closed. The same applies for the remaining groups of switches S3A–S3H; ...; S8A–S8H.

If, for instance, the switch S1A is closed and a 0 signal, i.e. a signal representing 0 potential, simultaneously appears at the output A of the shift register SR1 due to the fact that a 0-bit of information is present in stage 1 of the shift register SR1, the diode D1 between the switch S1A and the output A of the shift register SR1 becomes conductive. As a result, the potential in the common conductor SL1 is reduced even more than would be the case if the switch S1A were closed and a signal representing a high potential were present at the output A of the shift register SR1. In fact, the potential in the common conductor SL1 is reduced to such an extent that both the Zener diode ZD1 and the transistor T9 which are connected with the common conductor SL1 via the resistor R15 become conductive. In this regard, the ratio of the resistances of the resistors R12 and R13 constituting the voltage divider for the switch S1A should be such that, when the diode D1 associated with the switch S1A is blocked, i.e. when the switch S1A is closed but a high potential is present at the output A of the shift register SR1, the potential in the common conductor SL1 is sufficiently low to cause the transistor T1 to become conductive but not low enough to cause the Zener diode ZD1 and the transistor T9 to become conductive. In other words, the ratio of the resistances of the resistors R12 and R13 constituting the voltage divider for the switch S1A should be selected in such a manner that the Zener diode ZD1 and the transistor T9 are blocked when the diode D1 associated with the switch S1A is blocked.

The preceding applies as well to the other stages 2–8 of the shift register SR1 and the corresponding switches S1B–S1H. The same also applies to each of the remaining shift registers SR2–SR8 and the associated groups of switches S2A–S2H; ...; S8A–S8H.

The components D1 and R12 associated with the switch S1A cooperate with the components SL1, R15, ZD1 and T9 associated with the group of switches S1A–S1H to define a logic circuit which always causes a 1 signal, i.e. a signal representing a high potential, to be generated at the output a of the collector of the transistor T9 when a 0-bit of information is present in stage one of the shift register SR1 and the switch S1A is simultaneously activated or closed. This logic circuit is here a NOR circuit. The logic circuit has an input e2 mentioned earlier as well as an input e1 which is located between the switch S1A and the corresponding output A of the shift register SR1. Data present in stage one of the shift register SR1 is fed into the logic circuit via the input e1 while data pertaining to the position of the switch S1A enters the logic circuit via the input e2. The components D1 and R12 associated with each of the remaining switches S1B–S1H of the group of switches S1A-S1H likewise cooperate with the components SL1, R15, ZD1 and T9 to form respective logic circuits similar to that for the switch S1A. Each logic circuit has an input e1 and an input e2. The components SL1, R15, ZD1 and T9 are common to all of the logic circuits for the group of switches S1A-S1H.

The components D2 and R22 associated with each switch of the group S2A-S2H cooperate with the corresponding components SL2, R25, ZD2 and T10 to define a series of logic circuits like those for the group of switches S1A-S1H. Again, the components SL2, R25, ZD2 and T10 are common to all logic circuits for the group of switches S2A-S2H. The same applies to the remaining groups of switches S3A-S3H; . . . S8A-S8H. All of these logic circuits have inputs e1 and e2. Similarly, the collector of each of the transistors T10-T16 has an output a such as that of the transistor T9.

FIG. 2 shows that the microcomputer M has two memories AK and AZ. The memory AZ is reproduced three times to illustrate the contents thereof at three different time intervals Z1-Z3 during operation. The memory AK is a change memory which temporarily stores data relating to changes in the operational states of the switches S1A-S8H, that is, which temporarily stores data indicating activation of a switch S1A-S8H when such switch S1A-S8H is activated to initiate or discontinue a function controlled thereby. The memory AZ is an instantaneous memory which stores data relating to the instantaneous operational states of the switches S1A-S8H or, in other words, data indicating whether or not the functions controlled by the switches S1A-S8H are being performed.

Each of the memories AK and AZ is divided into eight sections A1-A8. The section A1 of each memory AK and AZ corresponds to the associated shift registers SR1 and SR9; the section A2 of each memory AK and AZ corresponds to the associated shift registers SR2 and SR10; and so on. Each of the sections A1-A8 contains a set of eight storage spaces or elements P1-P8. Advantageously, each storage space P1-P8 is designed to store one bit of information. The storage spaces P1-P8 have respective inputs and outputs which have not been illustrated.

The data output DA1 of the microcomputer M is associated with the section A1 of the instantaneous memory AZ; the data output DA2 of the microcomputer M is associated with the section A2 of the instantaneous memory AZ; and so on. The microcomputer M is designed to generate various series of clocking pulses CL at different times in order to perform various operations. Each such series consists of eight clocking pulses CL, that is, that number of clocking pulses CL in each series is equal to the number of stages 1-8 in the shift registers SR1-SR16 and the number of storage spaces P1-P8 in the sections A1-A8.

When the microcomputer M generates the first clocking pulse CL of a predetermined series, the data output DA1 of the microcomputer M is connected with the output of the storage space P1 belonging to the section A1 of the instantaneous memory AZ. During the second clocking pulse CL, the data output DA1 is connected with the storage space P2 of the section A1 belonging to the instantaneous memory AZ. The data output DA1 is sequentially connected with the remaining storage spaces P3-P8 of the section A1 belonging to the instantaneous memory AZ in response to the remaining clocking pulses CL of the predetermined series.

The data output DA1 is thus connected with the outputs of each of the eight storage spaces P1-P8 belonging to the section A1 of the instantaneous memory AZ during the eight clocking pulses CL of the predetermined series. During this same series of clocking pulses CL, the data output DA2 of the microcomputer M is sequentially connected with the outputs of the storage spaces P1-P8 belonging to the section A2 of the instantaneous memory AZ; the data output DA3 of the microcomputer M is sequentially connected with the outputs of the storage spaces P1-P8 belonging to the section A3 of the instantaneous memory AZ; and so on for the remaining data outputs DA4-DA8 of the microcomputer M. In other words, each of the data outputs DA1-DA8 of the microcomputer M is sequentially connected with the outputs of the storage spaces P1-P8 belonging to the associated section A1-A8 of the instantaneous memory AZ in synchronism with the clocking pulses CL of the predetermined series. In this manner, signals representative of the contents of the storage sections A1-A8 belonging to the instantaneous memory AZ may be transmitted to the respective indicating shift registers SR1-SR8, as well as the respective activating shift registers SR9-SR16, by means of the clocking pulses CL of the predetermined series. The instantaneous memory AZ is designed in such a manner that the contents thereof remain intact when signals representative of such contents are transmitted to the shift registers SR1-SR16.

Although the activating shift registers SR9-SR16 receive signals representative of the contents of the instantaneous memory AZ during the predetermined series of clocking pulses CL, the activating shift registers SR9-SR16 are designed in such a manner that the respective outputs A-H thereof are sampled only in response to generation of an enabling signal E by the microcomputer M. The enabling signal E is sent from the enabling output EA of the microcomputer M to the enabling inputs EE of the activating shift registers SR9-SR16.

The data input E1 of the microcomputer M is associated with the storage section A2 of the change memory AK; the data input E2 of the microcomputer M is associated with the storage section A2 of the change memory AK; and so on. The microcomputer M is so designed that the data input E1 is sequentially connected with the inputs of the storage spaces P1-P8 belonging to the storage section A1 of the change memory AK during a preselected series of eight clocking pulses CL. Similarly, the data input E2 of the microcomputer M is sequentially connected with the inputs of the storage spaces P1-P8 belonging to the storage section A2 of the change memory AK during the same preselected series of clocking pulses CL. The remaining data inputs E3-E8 of the microcomputer M are likewise sequentially connected with the storage spaces P1-P8 of the associated sections A3-A8 belonging to the change memory AK when the microcomputer M generates the preselected series of clocking pulses CL.

By way of example, it is now assumed that the switch S1A and none of the remaining switches S1B-S8H is activated or closed. The potential at the base of the transistor T1 is then reduced to such an extent via the voltage divider R12, R13 associated with the switch S1A that the transistor T1 becomes conductive. This causes a 1 control signal KD to manifest itself at the collector of the transistor T1 and hence in the control conductor SL. The 1 control signal KD indicates that at least one of the switches S1A–S8H has been activated but does not identify the activated switch or switches. The 1 control signal KD is present as long as at least one of the switches S1A–S8H, in the present example the switch S1A, remains in its closed position.

The 1 control signal KD initiates an identification routine in the microcomputer M which proceeds as follows:

The data outputs DA1–DA8 of the microcomputer M undergo internal switching so that they are connected to a signal generator which is capable of generating signals representing bits of information. The microcomputer M generates an initial series of clocking pulses CL. With each clocking pulse CL, a 1-bit of information is delivered to each of the indicating shift registers SR1–SR8 via the respective data input DE. Accordingly, 1-bits of information are progressively supplied to the various stages 1–8 of the shift registers SR1–SR8 in synchronism with the clocking pulses CL. As a result, a 1 signal, i.e. a signal representing a high potential, is present at all of the outputs A–H of each shift register SR1–SR8 after the eighth or final clocking pulse CL. This normalizes or clears the shift registers SR1–SR8.

The microcomputer M now generates a second series of eight clocking pulses CL. With the first clocking pulse CL of the second series, a 0-bit of information is supplied to stage one of each indicating shift register SR1–SR8 via the respective data input DE. Accordingly, a 0 signal, i.e. a signal representing zero potential, is present at the output A of each of the indicating shift registers SR1–SR8. This 0 signal constitutes a reference signal. Inasmuch as the switch S1A is closed and the diode D1 associated with the switch S1A is thus conductive, a 0 signal exists not only at the input e1 of the logic circuit corresponding to the switch S1A but also at the input e2 of this circuit. As a result, the Zener voltage of the Zener diode ZD1 is exceeded since the potential at the positive pole (+) of the source of operating voltage, and hence the potential at the emitter of the transistor T9, is greater than the Zener voltage. In the present case, the Zener voltage of the Zener diode ZD1 is of the order of 2.7 volts while the potential at the positive pole of the source of operating voltage is approximately 5 volts. The transistor T9 accordingly becomes conductive so that a 1 signal constituting an identifying signal is delivered from the output a of the transistor T9 to the data input e1 of the microcomputer M via the identification conductor SE1. The data input E1 of the microcomputer M is connected with the storage space P1 of the storage section A1 belonging to the change memory AK during the first clocking pulse CL of the second series of clocking pulses CL. The 1 identifying signal delivered to the data input e1 is therefore transmitted to the storage space P1 belonging to the storage section A1 of the change memory AK. The 1 identifying signal is supplied to this storage space P1 in the form of a 1-bit of information. In contrast, a 0 signal in the form of a 0-bit of information is supplied to the storage spaces P1 of each of the remaining storage sections A2–A8 of the change memory AK since a 0 identifying signal is present in each of the identification conductors SE2–SE8. This is due to the fact that all of the switches of the groups S2A–S2H; . . . ; S8A–S8H corresponding to the identification conductors SE2–SE8 are open. Consequently, the Zener diodes ZD2–ZD8, and hence all of the transistors T10–T16, are blocked. Furthermore, during the first clocking pulse CL of the second series of clocking pulses CL, a 1 signal is present at the outputs B–H of the respective stages 2–8 of all the shift registers SR1–SR8. Thus, even if one of the switches S2B–S2H; . . . ; S8B–S8H were closed during this first clocking pulse CL, the Zener diodes ZD2–ZD8, as well as the corresponding transistors T10–T16, would remain blocked.

With the seven remaining clocking pulses CL of the second series of eight clocking pulses CL, the 0-bit of information in each shift register SR1–SR8 is shifted from stage one into the other seven stages 2–8. Simultaneously, a 1-bit of information from the above mentioned signal generator of the microcomputer M is delivered to each of the shift registers SR1–SR8 during each of the last seven clocking pulses CL of the second series. In other words, a 1-bit of information is supplied to each stage 1–7 of each shift register SR1–SR8 after the 0-bit of information has been shifted to the following one of the stages 2–8.

A 0-bit of information is sequentially shifted into the stages 1–8 of each shift register SR1–SR8 during the second series of clocking pulses CL. However, only one of the stages 1–8 of each shift registers SR1–SR8 contains a 0-bit of information during each clocking pulse CL. A 0 signal sequentially appears at the outputs A–H of each shift register SR1–SR8 due to progression of the 0-bits of information through the stages 1–8 of the shift registers SR1–SR8. The 0 signal causes a signal at an input e1 of a logic circuit associated with a switch S1A–S1H to be different depending upon whether the respective switch S1A–S8H is open or closed. The inputs e1 of the logic circuits associated with the respective groups of switches S1A–S1H; . . . ; S8A–S8H are sequentially sampled by virtue of the fact that the outputs A–H of the corresponding shift registers SR1–SR8 are sequentially supplied with 0 signals. The result is a series of identifying signals in each of the identification conductors SE1–SE8. The first signal in each series is representative of the position of the respective switch S1A, S2A, S3A . . . S8A; the second signal in each series is representative of the position of the respective switch S1B, S2B, S3B . . . S8B; the third signal in each series is representative of the position of the respective switch S1C, S2C, S3C . . . S8C; and so on. The identifying signals of each series are generated in synchronism with the clocking pulses CL of the second series of clocking pulses CL. Since the data inputs E1–E8 of the microcomputer M are sequentially connected with the storage spaces P1–P8 of the respective storage sections A1–A8 belonging to the change memory AK in synchronism with the clocking pulses CL of the second series, each of the storage spaces P1–P8 of the change memory AK is supplied with a bit of information representing the position of one of the switches S1A–S8H. Each of the storages spaces P1–P8 of the storage section A1 is supplied with a bit of information representing the position of a respective switch of the group S1A–S1H; each of the storage spaces P1–P8 of the storage section A2 is supplied with a bit of information representing the position of a respective switch of the group S2A–S2H; each storage space P1–P8 of the storage section A3 is supplied with a bit of information representing the position of a respective switch of the group S3A–S3H; and so on. This completes the identification routine.

At the end of the identification routine, the storage space P1 which belongs to the storage section A1 of the change memory AK and corresponds to the switch S1A contains a 1-bit of information. This is indicated by a cross in FIG. 2. The remaining storage spaces P2-P8 of the storage section A1, as well as all of the storage spaces P1-P8 of each storage section A2-A8, contain 0-bits of information. In FIG. 2, this is illustrated by leaving the corresponding boxes of the change memory AK empty.

As indicated by Z1 in FIG. 2, the instantaneous memory AZ contains data obtained during an earlier identification routine. Again, a box with a cross represents a storage space P1-P8 with a 1-bit of information while an empty box represents a storage space P1-P8 with a 0-bit of information. Either during or after the identification routine described above, the contents of the instantaneous memory AZ as represented by Z1 are subjected to a nonequivalent or exclusive OR comparison with the contents of the change memory AK. This is performed by comparing the contents of corresponding storage spaces P1-P8 of the change memory AK and the instantaneous memory AZ. Thus, the storage spaces P1 of the two storage sections A1 are connected via a nonequivalent or exclusive OR coupling; the storage spaces P2 of the two storage sections A1 are connected via a nonequivalent or exclusive OR coupling; and so on. Whenever the contents of a pair of storage spaces P1-P8 differ, that is, are nonequivalent, a 1-bit of information is delivered to the respective storage space P1-P8 of the instantaneous memory AZ. Subsequent to the nonequivalent comparison, the contents of the instantaneous memory AZ are as indicated at Z2. In addition to the 1-bits of information which were previously stored in the instantaneous memory AZ due to earlier activation of certain of the switches S1B-S8H, the instantaneous memory AZ now includes a 1-bit of information in the storage space P1 belonging to the storage section A1 and corresponding to the switch S1A.

The contents of the instantaneous memory AZ as indicated at Z1 represent the data contained in the instantaneous memory AZ during the preceding cycle of operation. The contents of the instantaneous memory AZ as indicated at Z2 represent the data to be retained by the instantaneous memory AZ during the next cycle of operation.

Up to this point, the switch S1A has been held in its closed position. When the switch S1A is released and thus opened, a third series of eight clocking pulses CL is generated by the microcomputer M. This series of clocking pulses CL causes signals representative of the new contents of the instantaneous memory AZ as represented by Z2 to be transmitted to the shift registers SR1-SR8. Data from each storage space P1-P8 of the storage section A1 is transmitted to a respective stage 1-8 of the shift register SR1; data from each storage space P1-P8 of the storage section A2 is transmitted to a respective stage 1-8 of the shift register SR2; and so on. The data from the instantaneous memory AZ undergoes inversion or negation before arriving at the shift registers SR1-SR8. Consequently, each stage 1-8 of a shift register SR1-SR8 corresponding to a box with a cross in the representation Z2 of the instantaneous memory AZ are supplied with a 0-bit of information while each stage 1-8 of a shift register SR1-SR8 corresponding to an empty box in the representation Z2 of the instantaneous memory AZ is supplied with a 1-bit of information. The light sources LED1-LED8 connected with those stages 1-8 of the shift registers SR1-SR8 which receive a 0-bit of information are either switched on at this time to thereby become illuminated or remain illuminated if previously switched on. Consequently, each light source LED1-LED8 associated with a switch S1A-S8H which has been activated so as to cause the performance of the corresponding function is lit and hence indicates that the function controlled by the respective switch S1A-S8H is being performed. The non-illuminated light sources LED1-LED8 indicate the non-performance of the functions controlled by the corresponding switches S1A-S8H.

Signals representative of the contents of the instantaneous memory AZ as indicated at Z2 are also transmitted to the activating shift registers SR9-SR16 during the third series of clocking pulses CL, i.e. simultaneously with the signals which are transmitted to the indicating shift registers SR1-SR8 and are representative of the contents of the instantaneous memory AZ as indicated at Z2. The data in each storage space P1-P8 of the storage section A1 is delivered to a respective stage 1-8 of the activating shift register SR9; the data in each storage space P1-P8 of the storage section A2 is delivered to a respective stage 1-8 of the activating shift register SR10; and so on. Once the signals representative of the contents of the instantaneous memory AZ as indicated at Z2 have been delivered to the activating shift registers SR9-SR16, the microcomputer M generates the enabling signal E at the enabling output EA. Delivery of the enabling signal E to the enabling inputs of the activating shift registers SR9-SR16 permits the outputs A-H of the shift registers SR9-SR16 to be sampled. This results in activation of the function generating elements connected with those outputs A-H of the shift registers SR9-SR16 which correspond to activate switches S1A-S8H, that is, switches S1A-S8H which have been moved so as to cause performance of the functions controlled thereby.

A function generating element may be deactivated by operating or closing the switch S1A-S8H which controls the same for a second time. This occurs as follows:

When the switch S1A is closed for a second time, a 1-bit of information is again delivered to the storage space P1 belonging to the storage section A1 of the change memory AK. At this time, the instantaneous memory AZ still retains the contents represented by Z2. If the contents of the change memory AK and the contents of the instantaneous memory AZ as represented by Z2 are non subjected to a nonequivalent comparison, the contents of the instantaneous memory AZ are revised so that the instantaneous memory AZ now contains data as indicated at Z3. The contents of the instantaneous memory AZ as indicated at Z3 differ from those as indicated at Z2 in that the storage space P1 which belongs to the storage section A1 and corresponds to the switch S1A again contains a 0-bit of information rather than a 1-bit of information. It will be observed that the contents of the instantaneous memory AZ has indicated at Z3 are identical with the contents as indicated at Z1. When signals representative of the contents of the instantaneous memory AZ as indicated at Z3 are transmitted to the shift registers SR1-SR16, all light sources LED1-LED8 corresponding to storage spaces P1-P8 having a 1-bit of information continue to be illuminated while all function generating elements corresponding to such storage spaces P1-P8 continue to operate. In contrast, all light sources LED1-LED8 corresponding to storage spaces P1-P8 having a 0-bit of information are extinguished while all function generating elements corresponding to such storage spaces P1-P8 are inactivate. Since the storage space P1 belonging to the storage section A1 and corresponding to the switch S1A has a 0-bit of information, the light source LED1 associated with the switch S1A is switched off and the function generating element controlled by the switch S1A is deactivated. In other words, the first activation of a switch S1A–S8H causes the corresponding function to be selected, i.e. to be performed, and the associated light source LED-1–LED8 to be switched on. Renewed activation of the same switch S1A–S8H causes the associated light source LED1–LED8 to be extinguished and the performance of the corresponding function to be discontinued.

If the frequency of the clocking pulses CL is sufficiently high, the switches S1A–S8H need only be operated briefly, that is, need only be tapped, in order to select or initiate the performance of the functions controlled thereby. The same applies for discontinuing the performance of a function. In the present case, the frequency of the clocking pulses CL is 100 kHz.

In the illustrated embodiment, there are $8 \times 8 = 64$ switches S1A–S8H for the same number of functions. Nevertheless, only eighteen conductors are required to connect the indicating unit EAE which contains components located in the immediate vicinity of the keyboard with the microcomputer M and with the shift registers SR9–SR16 remotely positioned in the region of the function generating elements.

It will be observed that the number of conductors required to connect the indicating unit EAE with the microcomputer M does not change when the number of switches in the indicating unit EAE, the number of associated components such as the light sources LED-1–LED8, the resistors R11–R81, the resistors R12–R82 and the diodes D1–D8, and the number of stages of each shift register are increased in order to permit selection and indication of a larger number of functions. As regards the microcomputer M, it is merely necessary to modify the same so that the number of clocking pulses CL generated during each shifting routine is appropriately increased and the capacities of the memories AZ and AK are suitably enlarged.

The circuit in accordance with the invention is preferably electronic in nature as is the case for the circuit illustrated in FIG. 1.

Without further analysis, the foregoing will so fully reveal the gist of the present invention that others can, by applying current knowledge, readily adapt it for various applications without omitting features that, from the standpoint of prior art, fairly constitute essential characteristics of the generic and specific aspects of our contribution to the art and, therefore, such adaptations should and are intended to be comprehended within the meaning and range of equivalence of the appended claims.

We claim:

1. An arrangement for indicating the operational status of switches, particularly for use in electronic musical instruments, comprising:
   (a) a plurality of groups of switches, said switches being individually operable between ON and OFF states to cause the performance of selected functions;
   (b) an indicator connected with each of said switches and designed to indicate the operational state of the respective switch;
   (c) a plurality of devices each having a first input, a clocking input, and a series of stages designed to receive signals in a predetermined sequence via the first input in response to the delivery of clocking pulses to the clocking input, each of said devices being associated with a different one of said groups, and each of said stages having a first output which is connected with a respective switch of the corresponding group and with the indicator for the switch;
   (d) a control unit having a control input, and a clocking input common to and connected with all of said clocking inputs of said devices, said control unit comprising at least one memory having a plurality of sets of storage elements, and each of said sets being associated with a different one of said devices, each of said storage elements being associated with a different stage of the corresponding device, and said control unit having a plurality of second outputs each of which is connected with the first input of a different one of said devices and is designed to be sequentially connected with the storage elements of the corresponding set, said control unit further having a plurality of second inputs each of which is associated with a different one of said devices and is designed to be sequentially connected with the storage elements of the corresponding set, and said control unit being designed to generate a first series of clocking pulses subsequent to arrival of a control signal at said control input to thereby cause a reference signal to be advanced from one stage of each of said devices to another in the respective predetermined sequence, said reference signals resulting in the generation of identifying signals representative of the operational states of said switches, and each of said second inputs being connected with the storage elements of the associated set in substantial synchronism with the arrival of the reference signal at the corresponding stages to thereby permit information representative of said identifying signals to be stored in the respective storage elements, said control unit also being designed to generate a second series of clocking pulses subsequent to said first series, and said second outputs being connected with the storage elements of the associated sets in the respective predetermined sequence and in substantial synchronism with said clocking pulses of said second series so as to permit operating signals representative of said identifying signals to be furnished to the respective stages of said devices, each of said indicators providing an indication of the operational state of the associated switch in dependence upon the respective operating signal;
   (e) a plurality of signal generating circuits each of which is associated with a different one of said groups and has a first conductor common to and connecting all switches of the group to the corresponding second input of said control unit, each of said circuits being designed to generate series of identifying signals in the respective predetermined sequence during said first series of clocking pulses and to transmit the series of identifying signals to the corresponding second input in the predetermined sequence, and each of said circuits also being designed to generate a control signal upon changing of at least one switch of the respective group to one of its states; and
   (f) a second conductor for transmitting control signals to said control input, said second conductor being common to all of said switches and connecting all of said circuits with said control input.

2. An arrangement as defined in claim 1, wherein said indicators comprise light sources.

3. An arrangement as defined in claim 2, wherein said light sources are light-emitting diodes.

4. An arrangement as defined in claim 2, wherein each of said light sources is arranged to be illuminated during performance of the function associated with the respective switch.

5. An arrangement as defined in claim 1, wherein said switches are key-operated.

6. An arrangement as defined in claim 1, wherein each of said switches is biased to a predetermined position thereof.

7. An arrangement as defined in claim 1, wherein said control unit comprises a computer.

8. An arrangement as defined in claim 7, wherein said computer is a microcomputer.

9. An arrangement as defined in claim 1, wherein each of said devices comprises a shift register.

10. An arrangement as defined in claim 1, wherein all of said devices have the same preselected number of stages.

11. An arrangement as defined in claim 10, wherein the number of clocking pulses in each of said series of clocking pulses equals said preselected number.

12. An arrangement as defined in claim 10, wherein the number of storage elements in each of said sets equals said preselected number.

13. An arrangement as defined in claim 1, wherein each of said circuits is a logic circuit.

14. An arrangement as defined in claim 1, wherein said control unit is designed to furnish a normalizing signal different from said reference signals to each of said stages via said second outputs and said first inputs, said normalizing signals being generated prior to said first series of clocking pulses in response to arrival of a control signal at said control input.

15. An arrangement as defined in claim 14, wherein said normalizing and reference signals represent opposite bits of information.

16. An arrangement as defined in claim 14, wherein said control unit generates another series of clocking pulses in order to transmit said normalizing signals to said stages.

17. An arrangement as defined in claim 1, said control unit being designed to generate additional signals during said first series of clocking pulses; and wherein said clocking pulses of said first series cause an additional signal to be furnished to a respective stage upon advancement of the corresponding reference signal from the stage.

18. An arrangement as defined in claim 17, wherein said additional and reference signals represent opposite bits of information.

19. An arrangement as defined in claim 1, wherein each of said storage elements is designed to store one bit of information.

20. An arrangement as defined in claim 1, wherein said one memory is designed such that the contents thereof remain unchanged when said operating signals are furnished to said stages.

21. An arrangement as defined in claim 1, said one memory being designed to store information representative of the instantaneous operational states of all of said switches; and wherein said control unit comprises another memory designed to receive and temporarily store information representative of changes in the operational states of said switches, said other memory having a plurality of sets of storage elements, and each set of said other memory being associated with a different set of said one memory, each storage element of said other memory being coupled to a different storage element of said one memory to thereby permit the transfer of information from said other memory to said one memory, and said other memory being located intermediate said second inputs and said one memory, said second inputs being arranged to be connected with the storage elements of said other memory during said first series of clocking pulses so that the storage elements of said one memory are coupled to said second inputs via the storage elements of said other memory.

22. An arrangement as defined in claim 21, wherein all of said devices have the same preselected number of stages and the number of storage elements in each of said sets equals said preselected number.

23. An arrangement as defined in claim 21, wherein each of said storage elements is designed to store one bit of information.

24. An arrangement as defined in claim 21, wherein the coupling between corresponding storage elements of said one memory and said other memory is a nonequivalent coupling.

25. An arrangement as defined in claim 1, comprising a voltage divider for each of said switches, each of said voltage dividers including first and second resistors located on opposite sides of the respective switch.

26. An arrangement as defined in claim 25, each of said first resistors having a common junction with the respective switch and the corresponding first output; and wherein a diode is arranged between each of said junctions and the corresponding first output.

27. An arrangement as defined in claim 25, wherein each of said second resistors is common to all switches of the respective group.

28. An arrangement as defined in claim 1, wherein each of said circuits comprises a blocking unit intermediate the respective group of switches and the corresponding second input, each of said blocking units having an input side and an output side, and each of said blocking units preventing the transmission of identifying signals to the respective second input while the voltage on the input side lies below a predetermined value.

29. An arrangement as defined in claim 28, wherein each of said blocking units comprises a Zener diode.

30. An arrangement as defined in claim 1, comprising a plurality of activating units each having first input means connected with a different one of said second outputs, clocking input means connected with said clocking output, and a series of stage elements designed to receive signals in a preselected sequence via the first input means in response to the delivery of clocking pulses to the clocking input means, each of said stage elements being associated with a different one of said switches, and each of said stage elements having first output means arranged to emit an activating signal for a selected function upon movement of the corresponding switch to one of its positions.

31. An arrangement as defined in claim 30, said control unit having an additional output, and each of said activating units having additional input means connected with said additional output; and wherein said control unit is designed to cause generation of said activating signals by transmitting an enabling signal to said activating units via said additional output and said additional input means.

32. An arrangement as defined in claim 30, wherein each of said activating units is connected in parallel with a different one of said devices.

33. An arrangement as defined in claim 30, wherein each of said activating units comprises a shift register.

* * * * *